United States Patent
Ren et al.

(10) Patent No.: US 10,276,741 B2
(45) Date of Patent: Apr. 30, 2019

(54) METHOD FOR ELIMINATING METAL COMPOSITES FROM POLYCRYSTALLINE SILICON CELL PIECE

(71) Applicant: Changzhou Shichuang Energy Technology Co., Ltd., Liyang, Jiangsu (CN)

(72) Inventors: Changrui Ren, Changzhou (CN); Liming Fu, Hangzhou (CN)

(73) Assignee: Changzhou Shichuang Energy Technology Co., Ltd. (CN)

(*) Notice: Subject to any disclaimer, the term of this patent is extended or adjusted under 35 U.S.C. 154(b) by 0 days.

(21) Appl. No.: 15/868,755

(22) Filed: Jan. 11, 2018

(65) Prior Publication Data
US 2018/0309015 A1    Oct. 25, 2018

(30) Foreign Application Priority Data

Apr. 19, 2017  (CN) .......................... 2017 1 0255951

(51) Int. Cl.
*H01L 31/18* (2006.01)
*H01L 21/322* (2006.01)
*H01L 31/0236* (2006.01)
*H01L 31/0368* (2006.01)

(52) U.S. Cl.
CPC ........ *H01L 31/186* (2013.01); *H01L 21/3221* (2013.01); *H01L 31/02363* (2013.01); *H01L 31/03682* (2013.01); *H01L 31/1804* (2013.01); *Y02E 10/50* (2013.01); *Y02P 70/521* (2015.11)

(58) Field of Classification Search
CPC ............ H01L 21/2026; H01L 21/3221; H01L 31/186
See application file for complete search history.

(56) References Cited

U.S. PATENT DOCUMENTS

| 6,852,371 B2* | 2/2005 | Sopori ................ H01L 21/2686 257/E21.318 |
| 8,008,107 B2* | 8/2011 | Kirscht ............... H01L 21/3221 257/E21.001 |
| 2003/0232495 A1* | 12/2003 | Moghadam .............. B05D 1/60 438/623 |

FOREIGN PATENT DOCUMENTS

CN        103794473    *    1/2014    ......... H01L 21/2636

OTHER PUBLICATIONS

Machine translation of CN103794473.*

* cited by examiner

*Primary Examiner* — Zandra V Smith
*Assistant Examiner* — John M Parker

(57) ABSTRACT

A method for eliminating metal composites from a polycrystalline silicon cell piece, comprising the steps of: injecting current into the polycrystalline silicon cell piece under a certain temperature by means of an electric injection method, thereby eliminating the metal composites from the interior of the polycrystalline silicon cell piece; the present invention discloses a simple process, a short processing-time, a low manufacturing cost, and can easily be scaled for manufacture.

4 Claims, No Drawings

METHOD FOR ELIMINATING METAL COMPOSITES FROM POLYCRYSTALLINE SILICON CELL PIECE

TECHNICAL FIELD OF THE INVENTION

The present invention relates to a method for eliminating metal composites from a polycrystalline silicon cell piece.

BACKGROUND OF THE INVENTION

During the process of manufacturing polycrystalline silicon cell pieces, primary metals precipitated in the silicon wafer can be easily decomposed into unstable metal composites under a high-temperature sintering treatment. These metal composites possess a certain composite activity, which is capable of seriously reducing the conversion efficiency of the polycrystalline silicon cell. During the use of the cell, metal composites can be converted into semi-stable metal composites having a high composite activity. These semi-stable metal composites can further decrease the conversion efficiency of the polycrystalline silicon cell. Even worse, metal atoms having a high composite activity can be formed during the later decomposition of the semi-stable metal composites, resulting in a low conversion efficiency of the polycrystalline silicon cell.

SUMMARY OF THE INVENTION

The purpose of the present invention is to solve the shortcomings in the prior art by providing a method for eliminating metal composites from a polycrystalline silicon cell piece, through which the conversion efficiency of the polycrystalline silicon cell piece can be effectively improved. The method of the present invention is simple, efficient and cost-effective, and can be scaled for mass production.

To achieve the above purpose, the present invention adopts the following technical solution:

A method for eliminating metal composites from a polycrystalline silicon cell piece, comprising the step of: injecting current into the polycrystalline silicon cell piece under a certain temperature by means of an electric injection method, thereby eliminating the metal composites from the interior of the polycrystalline silicon cell piece.

In another preferred embodiment, the electric injection method specifically comprises the step of: imposing positive bias voltage onto the polycrystalline silicon cell piece.

In another preferred embodiment, the electric injection is achieved within a temperate of 250~350° C.

In another preferred embodiment, during the electric injection process, the injection current is controlled within a range of 600~800 mA/cm$^2$.

In another preferred embodiment, during the electric injection process, the injection time is controlled within a range of 0.5-1 min.

In another preferred embodiment, the front surface of the polycrystalline silicon cell piece is textured via a wet black silicon texturing method. The front surface of the polycrystalline silicon cell piece is provided with five main gate lines, and is plated with a silicon nitride protective film. The back surface of the polycrystalline silicon cell piece is passivated and plated with an aluminum-oxide and silicon-nitride laminated film. The outermost layer of the back surface of the polycrystalline silicon cell piece includes a printed aluminum paste.

In another preferred embodiment, the front surface of the polycrystalline silicon cell piece is textured via a wet black silicon texturing method. The front surface of the polycrystalline silicon cell piece is provided with five main gate lines, and is plated with a silicon nitride protective film. The back surface of the polycrystalline silicon cell piece is provided with printed aluminum paste.

In another aspect of the present invention, the effect of eliminating metal composites from the polycrystalline silicon cell piece can be verified by comparing the performances of the polycrystalline silicon cell piece before and after the electric injection process.

In another preferred embodiment, the comparison performances comprise cell efficiency, open-circuit voltage, short-circuit current and fill factor.

Compared with the prior art, the present invention has the following advantages:

The present invention provides a method for eliminating metal composites from a polycrystalline silicon cell piece to improve the conversion efficiency of the polycrystalline silicon cell piece; wherein the method of the present invention has a simple process, a short processing-time, a low manufacturing cost, and can be scaled for mass production.

The present invention can accelerate the conversion of the metal composites. Namely, the metal composites can be easily converted into metal ions capable of being captured by the surface of the polycrystalline silicon cell piece. Thus, the efficiency of the polycrystalline silicon cell piece can be greatly improved. More specifically, the method of the present invention can rapidly decompose the metal composites in the polycrystalline silicon cell piece into metal atoms, and further diffuse the metal atoms onto the surface of the cell piece. Thus, the metal atoms have high composite activity that can be completely captured by the surface of the cell piece, thereby losing the composite activity. As a result, the efficiency of the polycrystalline silicon cell piece can be significantly enhanced. Furthermore, during the later use of the polycrystalline silicon cell piece, the efficiency attenuation no longer occurs.

According to the method of the present invention, the conversion efficiency of the polycrystalline silicon solar cell can be greatly enhanced, and the absolute value of the efficiency of the polycrystalline silicon solar cell can be improved by about 0.2%. Meanwhile, the present invention is especially suitable for high-efficiency polycrystalline PERC cells.

The present invention has a simple process, and can be realized by cost-effective equipment. Meanwhile, due to the short processing time and low energy consumption, the present invention can be scaled for mass-production.

DETAILED DESCRIPTION OF THE INVENTION

Drawings and detailed embodiments are combined hereinafter to elaborate the technical principles of the present invention.

Embodiment 1

A method for eliminating metal composites from a polycrystalline silicon cell piece, comprising the steps of: injecting current into the polycrystalline silicon cell piece under a certain temperature by means of an electric injection method, thereby eliminating the metal composites from the interior of the polycrystalline silicon cell piece. The effect of eliminating metal composites from the polycrystalline silicon cell piece can be verified by comparing the performances of the polycrystalline silicon cell piece before and after the electric injection process. The performances of comparison comprise cell efficiency Eff, open-circuit voltage Voc, short-circuit current Isc and fill factor FF.

The front surface of the polycrystalline silicon cell piece is textured via a wet black silicon texturing method. The front surface of the polycrystalline silicon cell piece is provided with five main gate lines, and is plated with a silicon nitride protective film. The back surface of the polycrystalline silicon cell piece is passivated, and is plated with an aluminum-oxide and silicon-nitride laminated film. The back surface of the polycrystalline silicon cell piece's outermost layer is provided with printed aluminum paste.

The specific process conditions are as follows:

The electric injection is performed at a temperature of 350° C.;

The electric injection method specifically comprises the step of: imposing positive bias voltage onto the polycrystalline silicon cell piece;

During the electric injection process, the injection current is controlled at 800 mA/cm$^2$;

During the electric injection process, the injection time is controlled at 0.5 min.

The performance test results of the polycrystalline silicon cell pieces before and after the electric injection are shown in the following table 1:

TABLE 1

| Performance Tests | Eff (%) | Voc (V) | Isc (A) | FF (%) |
| --- | --- | --- | --- | --- |
| Before electric injection | 19.68 | 0.6508 | 9.373 | 79.24 |
| After electric injection | 19.88 | 0.6538 | 9.397 | 79.49 |

As can be seen from table 1, the electric injection process of the present invention effectively eliminates metal precipitation in the polycrystalline silicon so that the composite materials in the silicon wafer are reduced. Thus, the efficiency of the polycrystalline silicon cell piece can be improved by 0.2% after the electric injection process.

Embodiment 2

Base on embodiment 1, the process conditions of embodiment 2 are modified as follows:

The electric injection is performed at a temperature of 300° C.;

The electric injection method specifically comprises the step of: imposing positive bias voltage onto the polycrystalline silicon cell piece;

During the electric injection process, the injection current is controlled at 700 mA/cm$^2$;

During the electric injection process, the injection time is controlled at 45 seconds.

The performance test results of the polycrystalline silicon cell pieces before and after the electric injection are shown in the following table 2:

TABLE 2

| Performance Tests | Eff (%) | Voc (V) | Isc (A) | FF (%) |
| --- | --- | --- | --- | --- |
| Before electric injection | 19.58 | 0.65 | 9.343 | 79.2 |
| After electric injection | 19.75 | 0.653 | 9.368 | 79.34 |

As can be seen from table 2, the electric injection process of the present invention effectively eliminates metal precipitation in the polycrystalline silicon so that the composite materials in the silicon wafer can be reduced. Thus, electric injection process improves the efficiency of the polycrystalline silicon cell piece by 0.17%.

Embodiment 3

Base on embodiment 1, the process conditions of embodiment 3 are modified as follows:

The electric injection is performed at a temperature of 250° C.;

The electric injection method specifically comprises the step of: imposing positive bias voltage onto the polycrystalline silicon cell piece;

During the electric injection process, the injection current is controlled at 600 mA/cm$^2$;

During the electric injection process, the injection time is controlled at 1 min.

The performance test results of the polycrystalline silicon cell pieces before and after the electric injection are shown in the following table 3:

TABLE 3

| Performance Tests | Eff (%) | Voc (V) | Isc (A) | FF (%) |
| --- | --- | --- | --- | --- |
| Before electric injection | 19.61 | 0.6512 | 9.342 | 79.21 |
| After electric injection | 19.79 | 0.6544 | 9.368 | 79.31 |

As can be seen from table 3, the electric injection process of the present invention effectively eliminates metal precipitation in the polycrystalline silicon so that the composite materials in the silicon wafer can be reduced. Thus, the efficiency of the polycrystalline silicon cell piece can be improved by 0.18% after the electric injection process.

Embodiment 4

A method for eliminating metal composites from a polycrystalline silicon cell piece, comprising the steps of: injecting current into the polycrystalline silicon cell piece under a certain temperature by means of an electric injection method, thereby eliminating the metal composites from the interior of the polycrystalline silicon cell piece. The effect of eliminating metal composites from the polycrystalline silicon cell piece can be verified by comparing the performances of the polycrystalline silicon cell piece before and after the electric injection process. The performances of comparison comprise cell efficiency Eff, open-circuit voltage Voc, short-circuit current Isc and fill factor FF.

The front surface of the polycrystalline silicon cell piece is textured via a wet black silicon texturing method. The front surface of the polycrystalline silicon cell piece is provided with five main gate lines, and is plated with a silicon nitride protective film. The back surface of the polycrystalline silicon cell piece is passivated, and is plated with an aluminum-oxide and silicon-nitride laminated film. The outermost layer of the back surface of the polycrystalline silicon cell piece is provided with printed aluminum paste.

The specific process conditions are as follows:

The electric injection is performed at a temperature of 300° C.;

The electric injection method specifically comprises the step of: imposing positive bias voltage onto the polycrystalline silicon cell piece;

During the electric injection process, the injection current is controlled at 800 mA/cm²;

During the electric injection process, the injection time is controlled at 0.5 min.

The performance test results of the polycrystalline silicon cell pieces before and after the electric injection are shown in the following table 4:

TABLE 4

| Performance Tests | Eff (%) | Voc (V) | Isc (A) | FF (%) |
|---|---|---|---|---|
| Before electric injection | 18.91 | 0.6355 | 9.103 | 80.32 |
| After electric injection | 19.09 | 0.6367 | 9.142 | 80.58 |

As can be seen from table 4, the electric injection process of the present invention effectively eliminates metal precipitation in the polycrystalline silicon so that the composite materials in the silicon wafer are reduced. Thus, the electric injection process improves the efficiency of the polycrystalline silicon cell piece by 0.18%.

Embodiment 5

Based on embodiment 4, the process conditions of embodiment 5 are modified as follows:

The electric injection is performed at a temperature of 330° C.;

The electric injection method specifically comprises the step of: imposing positive bias voltage onto the polycrystalline silicon cell piece;

During the electric injection process, the injection current is controlled at 650 mA/cm²;

During the electric injection process, the injection time is controlled at 50 seconds.

The performance test results of the polycrystalline silicon cell pieces before and after the electric injection are shown in the following table 5:

TABLE 5

| Performance Tests | Eff (%) | Voc (V) | Isc (A) | FF (%) |
|---|---|---|---|---|
| Before electric injection | 18.85 | 0.6351 | 9.087 | 80.28 |
| After electric injection | 18.97 | 0.6364 | 9.115 | 80.36 |

As can be seen from table 5, the electric injection process of the present invention effectively eliminates metal precipitation in the polycrystalline silicon so that the composite materials in the silicon wafer can be reduced. Thus, the efficiency of the polycrystalline silicon cell piece can be improved by 0.12% after the electric injection process.

Embodiment 6

Base on embodiment 4, the process conditions of embodiment 6 are modified as follows:

The electric injection is performed at a temperature of 280° C.;

The electric injection method specifically comprises the step of: imposing positive bias voltage onto the polycrystalline silicon cell piece;

During the electric injection process, the injection current is controlled at 750 mA/cm²;

During the electric injection process, the injection time is controlled at 55 seconds.

The performance test results of the polycrystalline silicon cell pieces before and after the electric injection are shown in the following table 6:

TABLE 6

| Performance Tests | Eff (%) | Voc (V) | Isc (A) | FF (%) |
|---|---|---|---|---|
| Before electric injection | 18.88 | 0.6351 | 9.103 | 80.22 |
| After electric injection | 19.02 | 0.6368 | 9.122 | 80.46 |

As can be seen from table 6, the electric injection process of the present invention effectively eliminates metal precipitation in the polycrystalline silicon so that the composite materials in the silicon wafer are reduced. Thus, the electric injection process improves the efficiency of the polycrystalline silicon cell piece by 0.14% after.

The description of above embodiments allows those skilled in the art to realize or use the present invention. Without departing from the spirit and essence of the present invention, those skilled in the art can combine, change or modify correspondingly according to the present invention. Therefore, the protective range of the present invention should not be limited to the embodiments above but conform to the widest protective range which is consistent with the principles and innovative characteristics of the present invention. Although some special terms are used in the description of the present invention, the scope of the invention should not necessarily be limited by this description. The scope of the present invention is defined by the claims.

The invention claimed is:

1. A method for eliminating metal composites from a polycrystalline silicon cell piece, comprising:
   injecting current into the polycrystalline silicon cell piece under a certain temperature by means of an electric injection method, thereby eliminating the metal composites from the interior of the polycrystalline silicon cell piece, wherein the electric injection comprises imposing positive bias voltage onto the polycrystalline silicon cell piece, wherein the electric injection is performed within a temperate of 250~350° C., wherein during the electric injection process, the injection current is controlled within a range of 600~800 mA/cm$^2$, wherein during the electric injection process, the injection time is controlled within a range of 0.5-1 min, wherein the electric injection is performed within a temperate of 300~350° C., and wherein the front surface of the polycrystalline silicon cell piece is textured via a wet black silicon texturing method, wherein the front surface of the polycrystalline silicon cell piece is provided with five main gate lines, and is plated with a silicon nitride protective film, wherein the back surface of the polycrystalline silicon cell piece is passivated, and is plated with an aluminum-oxide and silicon-nitride laminated film, wherein the outermost layer of the back surface of the polycrystalline silicon cell piece is provided with printed aluminum paste.

2. The method for eliminating metal composites from a polycrystalline silicon cell piece of claim 1, wherein the effect of eliminating metal composites from the polycrystalline silicon cell piece can be verified by comparing the cell efficiency, open-circuit voltage, short-circuit voltage and fill factor of the polycrystalline silicon cell piece before and after the electric injection process.

3. A method for eliminating metal composites from a polycrystalline silicon cell piece, comprising injecting current into the polycrystalline silicon cell piece under a certain temperature by means of an electric injection method, thereby eliminating the metal composites from the interior of the polycrystalline silicon cell piece, wherein the electric injection comprises imposing positive bias voltage onto the polycrystalline silicon cell piece, wherein the electric injection is performed within a temperate of 250~350° C., wherein during the electric injection process, the injection current is controlled within a range of 600~800 mA/cm$^2$, wherein during the electric injection process, the injection time is controlled within a range of 0.5-1 min, wherein the electric injection is performed within a temperate of 300-350° C., wherein the front surface of the polycrystalline silicon cell piece is textured via a wet black silicon texturing method, wherein the front surface of the polycrystalline silicon cell piece is provided with five main gate lines, and is plated with a silicon nitride protective film, wherein the back surface of the polycrystalline silicon cell piece is provided with printed aluminum paste.

4. The method for eliminating metal composites from a polycrystalline silicon cell piece of claim 3, wherein the effect of eliminating metal composites from the polycrystalline silicon cell piece can be verified by comparing the cell efficiency, open-circuit voltage, short-circuit voltage and fill factor of the polycrystalline silicon cell piece before and after the electric injection process.

* * * * *